(12) United States Patent
Kobayashi et al.

(10) Patent No.: US 8,263,975 B2
(45) Date of Patent: Sep. 11, 2012

(54) LAMINATE, PREPARATORY SUPPORT, METHOD FOR PRODUCING LAMINATE, AND METHOD FOR PRODUCING DEVICE

(75) Inventors: Yoshihiro Kobayashi, Noda (JP); Toshihiko Takeda, Ichikawa (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 114 days.

(21) Appl. No.: 12/886,697

(22) Filed: Sep. 21, 2010

(65) Prior Publication Data

US 2011/0073847 A1 Mar. 31, 2011

(30) Foreign Application Priority Data

Sep. 29, 2009 (JP) .................................. 2009-224790

(51) Int. Cl.
*H01L 29/08* (2006.01)
*H01L 35/24* (2006.01)
*H01L 51/00* (2006.01)

(52) U.S. Cl. .......... 257/40; 438/458; 438/459; 438/464; 257/E51.001

(58) Field of Classification Search .................. 430/200; 438/458, 459, 464; 257/40, E51.002

See application file for complete search history.

(56) References Cited

U.S. PATENT DOCUMENTS

| | | | |
|---|---|---|---|
| 4,923,860 A * | 5/1990 | Simons | 503/227 |
| 6,284,307 B1 * | 9/2001 | Fukuzawa et al. | 427/66 |
| 6,372,608 B1 * | 4/2002 | Shimoda et al. | 438/455 |
| 6,645,830 B2 * | 11/2003 | Shimoda et al. | 438/455 |
| 7,452,752 B2 | 11/2008 | Noda et al. | |
| 7,674,749 B2 * | 3/2010 | Kang et al. | 503/227 |
| 7,993,806 B2 * | 8/2011 | Takagi et al. | 430/200 |
| 8,080,811 B2 * | 12/2011 | Yokoyama et al. | 250/492.1 |
| 2004/0110322 A1 * | 6/2004 | Hougham et al. | 438/119 |
| 2005/0164480 A1 * | 7/2005 | Haubrich et al. | 438/597 |
| 2006/0063351 A1 * | 3/2006 | Jain | 438/455 |
| 2009/0195152 A1 * | 8/2009 | Sawano | 313/504 |
| 2009/0197017 A1 * | 8/2009 | Tanaka et al. | 427/596 |
| 2010/0038035 A1 | 2/2010 | Noda et al. | |
| 2010/0041211 A1 | 2/2010 | Noda et al. | |
| 2010/0072490 A1 * | 3/2010 | Kerr et al. | 257/88 |
| 2010/0073268 A1 * | 3/2010 | Matsunaga et al. | 345/76 |

FOREIGN PATENT DOCUMENTS

| | | |
|---|---|---|
| JP | 10-125929 A1 | 5/1998 |
| JP | 2004-064040 A1 | 2/2004 |
| JP | 2005-159155 A1 | 6/2005 |

\* cited by examiner

*Primary Examiner* — Jarrett Stark
(74) *Attorney, Agent, or Firm* — Burr & Brown (57) ABSTRACT

There are provided a laminate, a preparatory support, a laminate production method and a device production method which make it possible to successfully produce a thin device on a flexible substrate which is likely to bend or break. A laminate 1A includes: a support 2A; a photothermal conversion layer 3A; a light blocking layer 4A; an adhesive layer 5A; a flexible substrate 6A; and a device element 7A, wherein the support 2A can be detached from the other layers by irradiating the photothermal conversion layer 3A with light, and wherein the adhesive layer 5A is formed such that it covers the side surface of the light blocking layer 4A.

14 Claims, 4 Drawing Sheets

LAMINATE, PREPARATORY SUPPORT, METHOD FOR PRODUCING LAMINATE, AND METHOD FOR PRODUCING DEVICE

CROSS-REFERENCE TO RELATED APPLICATIONS

The present patent application benefits from Japanese Patent Application No. 2009-224790 filed on Sep. 29, 2009, the entire content of which is hereby incorporated by reference into the present application.

BACKGROUND OF THE INVENTION

1. Field of the Invention

The present invention relates to a laminate, a preparatory support for producing the laminate, a method for producing a laminate, and a method for producing a device.

2. Background Art

In the field of semiconductor technology, studies are being made to produce a thinner semiconductor wafer (hereinafter also referred to simply as "wafer") in order to respond to the progress toward thinner packages and higher-density devices through development of chip stacking techniques. Thinning of a wafer is performed by so-called back grinding, i.e. grinding of a wafer surface opposite to a patterned surface. Due to warpage of a wafer caused by thinning, however, such wafer thinning entails problems such as difficulty in securing the uniformity of thickness upon grinding of the wafer, difficulty in transporting the wafer, the occurrence of chipping (edge chipping) during dicing of the wafer into chips, etc. To carry out wafer back grinding with high thickness uniformity, facilitate wafer transport and prevent the occurrence of chipping, a technique has been employed which involves fixing a wafer before thinning on a rigid support, performing back grinding, transport and dicing of the fixed wafer, and detaching the wafer or diced chips after thinning from the support.

With a view to providing a laminate in which a substrate to be ground is fixed on a support, and the substrate after grinding can be easily detached from the support, patent document 1 describes a laminate comprising a substrate to be ground, a bonding layer in contact with the substrate, a photothermal conversion layer containing a light absorbing agent and a heat decomposable resin, and a light-permeable support. The photothermal conversion layer decomposes when the layer is irradiated with a radiation energy after grinding the substrate surface opposite to the surface in contact with the bonding layer, so that the substrate after grinding can be separated from the light-permeable support.

With a view to providing a method which, in a process for producing semiconductor chips comprising the step of dicing a semiconductor wafer, can effectively prevent chipping during the dicing step, patent document 2 describes a method for producing semiconductor chips. In particular, the chip production method comprises the steps of: applying a photothermal conversion layer containing a light absorbing agent and a heat decomposable resin onto a light-permeable support (the photothermal conversion layer, when irradiated with a radiation energy, converts the radiation energy into heat and is decomposed by the heat); providing a semiconductor wafer having a patterned surface with a circuit pattern, and a non-patterned surface opposite to the patterned surface, bonding the semiconductor wafer and the light-permeable support together with a photo-curable adhesive such that the patterned surface faces the photothermal conversion layer, and applying light to the photo-curable adhesive layer from the light-permeable support side to cure the photo-curable adhesive layer, thereby forming a laminate having outermost the non-patterned surface; grinding the non-patterned surface of the semiconductor wafer until a predetermined thickness of the semiconductor wafer is reached; dicing the ground semiconductor wafer from the non-pattered surface side into semiconductor chips; applying a radiation energy to the photothermal conversion layer from the light-permeable support side to decompose the photothermal conversion layer, thereby separating the semiconductor chips having the adhesive layer from the light-permeable support; and removing the adhesive layer from the semiconductor chips.

In the field of liquid crystal display (LCD) technology using a thin film transistor (TFT), an LCD is produced through the step of forming a thin transistor on a transparent substrate e.g. by CVD. Because high heat resistance is required for the transparent substrate, quartz glass or heat-resistance glass is used for the substrate. Such a substrate of quartz glass or heat-resistance glass is fragile and heavy in weight, and therefore entails the problem of difficult handling upon the production of a large-sized LCD. Therefore, a method is employed in which after a thin transistor is formed on a rigid support, a quartz glass or high-resistant glass substrate is superimposed as a transfer medium on the support, and then the support is detached.

With a view to providing a detachment method capable of easy detachment of an object irrespective of the properties, conditions, etc. of the object, and in particular capable of transfer to various transfer media, patent document 3 describes a detachment method for detaching an object, which is present on a substrate via a separation layer which is a laminate of a plurality of layers, from the substrate, the method comprising irradiating the separation layer with light to cause separation of the layer within the layer and/or at the interfaces, thereby detaching the object from the substrate.

Patent document 1: Japanese Patent Laid-Open Publication No. 2004-64040 (claim 1, paragraph 0005)
Patent document 2: Japanese Patent Laid-Open Publication No. 2005-159155 (claim 1, paragraph 0007)
Patent document 3: Japanese Patent Laid-Open Publication No. H10-125929 (claim 1, paragraph 0006)

Thus, in the fields of semiconductor technology and LCD technology, in order to overcome the problems such as deflection or warpage of a wafer upon the production of the wafer or a thin transistor, difficulty in processing or handling of a wafer, on which a thin transistor is to be formed, because of the fragileness of the substrate, etc., a technique is used which involves producing a wafer or a thin transistor with the wafer fixed on a rigid support, and then detaching the rigid support.

Problems similar to the wafer deflection or warpage problem and the problem of difficulty in processing or handling a substrate because of its fragileness, will occur when producing a thin device comprising a flexible substrate and a device formed on it, such as an organic electroluminescence device (organic EL device), an organic transistor device or a solar cell device. In particular, a large-sized flexible substrate is likely to bend or break depending on the material used. It is difficult to transport such a large-sized substrate in a horizontal position or in a stable manner, making it difficult to form a device on the flexible substrate.

To enable stable production of such a thin device, therefore, application of the above-described techniques employed in the fields of semiconductor wafers and LCDs has been an important technical problem. In particular, in such an applied technique, a flexible substrate is fixed on a rigid support via an adhesive layer and a photothermal conversion layer which can be detached by irradiation with laser light. After forming a device on the flexible substrate fixed on the support, the photothermal conversion layer is irradiated e.g. with laser light, thereby decomposing the photothermal conversion layer and separating the rigid support from the substrate.

SUMMARY OF THE INVENTION

The present invention has been made to solve the above problems; and it is therefore a first object of the present invention to provide a laminate which makes it possible to successfully produce a thin device on a flexible substrate which is likely to bend or break.

The present invention has been made to solve the above problems; and it is therefore a second object of the present invention to provide a preparatory support for use in a laminate which makes it possible to successfully produce a thin device on a flexible substrate which is likely to bend or break.

The present invention has been made to solve the above problems; and it is therefore a third object of the present invention to provide a method for producing a laminate which makes it possible to successfully produce a thin device on a flexible substrate which is likely to bend or break.

The present invention has been made to solve the above problems; and it is therefore a fourth object of the present invention to provide a device production method which makes it possible to successfully produce a device comprising a flexible substrate which is likely to bend or break, and a thin device formed on the substrate.

Through the present inventors' studies on the practical applicability of a technique which involves fixing a flexible substrate on a rigid support via an adhesive layer and a photothermal conversion layer which can be detached by irradiation with laser light, handling the resulting laminate and forming a device on the flexible substrate, and thereafter irradiating the photothermal conversion layer with laser light or the like to decompose the photothermal conversion layer, thereby detaching the rigid support, the following two problems have been newly found:

The first problem is that in the case of an organic EL device or an organic transistor device in which a device is composed of an organic compound, such a device is relatively weak against irradiation with heat or light because of the inclusion of an organic compound. Thus, when the photothermal conversion layer is irradiated with laser light or the like to detach the support, the device can be destroyed by light leaking from the photothermal conversion layer. The present inventors have found that to solve the problem, it is necessary to provide a light blocking layer (e.g. a reflective layer of an aluminum film) between the flexible substrate and the photothermal conversion layer so that laser light, irradiating the photothermal conversion layer, will not reach the device.

The second problem is that during acid etching or alkali treatment of a member such as an electrode, which treatment is necessary for fine processing in the production of a device, the light blocking layer may be deteriorated by an acid or an alkali.

Through the present inventors' intensive studies made to solve the above two problems, it has been found that the problems can be solved by protecting the light blocking layer by using an improved method for forming the adhesive layer. The present invention has been accomplished based on the finding.

In order to solve the above problems, the present invention provides a laminate comprising: a support; a photothermal conversion layer provided on the support; a light blocking layer formed on the photothermal conversion layer; an adhesive layer formed on the light blocking layer; a flexible substrate formed on the adhesive layer; and a device element formed on the flexible substrate, wherein the support can be detached from the other layers by irradiating the photothermal conversion layer with light, and wherein the adhesive layer is formed such that it covers the side surface of the light blocking layer.

The laminate according to this invention comprises: a support; a photothermal conversion layer provided on the support; a light blocking layer formed on the photothermal conversion layer; an adhesive layer formed on the light blocking layer; a flexible substrate formed on the adhesive layer; and a device element formed on the flexible substrate, wherein the support can be detached from the other layers by irradiating the photothermal conversion layer with light, and wherein the adhesive layer is formed such that it covers the side surface of the light blocking layer. Thus, when the photothermal conversion layer is irradiated with light to decompose the photothermal conversion layer and thereby detach the support, the light blocking layer blocks light leaking into the device side, thereby protecting the device. In addition, because the adhesive layer covers the side surface of the light blocking layer to protect the light blocking layer, deterioration of the light blocking layer can be prevented even when the substrate is subjected to treatment with an acid or an alkali in the production of the device. The laminate of this invention can thus successfully produce a thin device on the flexible substrate which is likely to bend or break. The "flexible substrate" herein refers to a substrate which is thin and flexible, and therefore is likely to bend (e.g. a plastic substrate or a plastic film) or which is rigid and thin, and therefore is likely to break (e.g. a glass substrate), and which should be fixed on a rigid support when producing a predetermined device element on it.

In a preferred embodiment of the laminate of the present invention, the adhesive layer is formed such that it further covers the side surface of the photothermal conversion layer.

Because the adhesive layer is formed such that it further covers the side surface of the photothermal conversion layer according to this embodiment, deterioration of the photothermal conversion layer can be prevented when the substrate is treated with an acid or an alkali in the production of the device. The laminate of this embodiment can thus more successfully produce a thin device element on the flexible substrate which is likely to bend or break.

In a preferred embodiment of the laminate of the present invention, the light blocking layer functions as a light reflecting layer.

According to this embodiment, the light blocking layer functions as a light reflecting layer. When the photothermal conversion layer is irradiated with light to decompose the photothermal conversion layer and thereby detach the support, such light blocking layer can more effectively block light leaking into the device element side. On the other hand, such light blocking layer is relatively easily deteriorated by treatment with an acid or an alkali in the production of the device. Protecting the side surface of the light blocking layer with the adhesive layer is therefore of more significance.

In a preferred embodiment of the laminate of the present invention, a focus position-indicating mark for focusing light onto the photothermal conversion layer is provided on the support.

According to this embodiment, a focus position-indicating mark for focusing light onto the photothermal conversion layer is provided on the support. Accordingly, when the photothermal conversion layer is irradiated with light to decompose the photothermal conversion layer and thereby detach the support, the photothermal conversion layer can be more securely irradiated with light. This can reduce leakage of light into the device element side, enabling enhanced protection of the device.

In a preferred embodiment of the laminate of the present invention, a glass substrate is used as the flexible substrate, a region in which the device element is not formed is present in a peripheral area of the flexible substrate, and a cut that surrounds the device element is provided in the region of the flexible substrate.

According to this embodiment, a glass substrate is used as the flexible substrate, a region in which the device is not formed is present in a peripheral area of the flexible substrate, and a cut that surrounds the device element is provided in the region of the flexible substrate. Accordingly, in the case where the flexible substrate is a thin glass substrate which is likely to break and a microcrack is present in a peripheral area of the substrate, if the microcrack grows into a crack e.g. due to thermal strain during a production process, the progress of cracking may be halted by the cut. In addition, detachment of the adhesive layer can be facilitated by detaching the adhesive layer after breaking the cut portion.

In a preferred embodiment of the laminate of the present invention, the device element is one of an organic EL device, an organic transistor device and a solar cell device.

Because the device element is one of an organic EL device, an organic transistor device and a solar cell device according to this embodiment, the device element tends to be deteriorated by leaking light when irradiating the photothermal conversion layer with light for detachment of the support. Further, treatment with an acid or an alkali is needed for fine processing in the production of the device element. Thus, the present invention is applied with more significance to such a device.

In order to solve the above problems, the present invention provides a preparatory support for use in a laminate, the laminate comprising: a support; a photothermal conversion layer provided on the support; a light blocking layer formed on the photothermal conversion layer; an adhesive layer formed on the light blocking layer; a flexible substrate formed on the adhesive layer; and a device element formed on the flexible substrate, wherein the support can be detached from the other layers by irradiating the photothermal conversion layer with light, and wherein the adhesive layer is formed such that it covers the side surface of the light blocking layer, said preparatory support comprising: a support; and a photothermal conversion layer provided on the support.

The preparatory support of this invention, for use in the laminate of the present invention, comprises a support and a photothermal conversion layer provided on the support. The preparatory support can provide the laminate which can successfully produce a thin device element on the flexible substrate which is likely to bend or break.

In order to solve the above problems, the present invention provides a method for producing a laminate, the laminate comprising: a support; a photothermal conversion layer provided on the support; a light blocking layer formed on the photothermal conversion layer; an adhesive layer formed on the light blocking layer; a flexible substrate formed on the adhesive layer; and a device element formed on the flexible substrate, wherein the support can be detached from the other layers by irradiating the photothermal conversion layer with light, and wherein the adhesive layer is formed such that it covers the side surface of the light blocking layer, said method comprising: a photothermal conversion layer-forming step of forming a photothermal conversion layer on a support; a light blocking layer-forming step of forming a light blocking layer on the photothermal conversion layer; an adhesive layer-forming step of forming an adhesive layer on the light blocking layer such that it covers the side surface of the light blocking layer; a flexible substrate-forming step of forming a flexible substrate on the adhesive layer; and a device-forming step of forming a device element on the flexible substrate at least through a step involving treatment with an acid or an alkali.

The laminate production method of this invention comprises a photothermal conversion layer-forming step of forming a photothermal conversion layer on a support; a light blocking layer-forming step of forming a light blocking layer on the photothermal conversion layer; an adhesive layer-forming step of forming an adhesive layer on the light blocking layer such that it covers the side surface of the light blocking layer; a flexible substrate-forming step of forming a flexible substrate on the adhesive layer; and a device-forming step of forming a device element on the flexible substrate at least through a step involving treatment with an acid or an alkali. Thus, when the photothermal conversion layer is irradiated with light to decompose the photothermal conversion layer and thereby detach the support, the light blocking layer blocks light leaking into the device element side, thereby protecting the device. In addition, because the adhesive layer covers the side surface of the light blocking layer to protect the light blocking layer, deterioration of the light blocking, layer can be prevented even when the substrate is subjected to treatment with an acid or an alkali in the production of the device. The laminate production method of this invention can thus successfully produce a thin device element on the flexible substrate which is likely to bend or break.

In order to solve the above problems, the present invention provides a method for producing a device comprising a flexible substrate and a device formed on the substrate, said method comprising: a photothermal conversion layer-forming step of forming a photothermal conversion layer on a support; a light blocking layer-forming step of forming a light blocking layer on the photothermal conversion layer; a light blocking layer-forming step of forming a light blocking layer on the photothermal conversion layer; an adhesive layer-forming step of forming an adhesive layer on the light blocking layer such that it covers the side surface of the light blocking layer; a flexible substrate-forming step of forming a flexible substrate on the adhesive layer; a device-forming step of forming a device element on the flexible substrate at least through a step involving treatment with an acid or an alkali; a photothermal conversion layer detachment step of irradiating the photothermal conversion layer with light, thereby detaching the support from the other layers; and an adhesive layer separation step of separating the adhesive layer from the flexible substrate.

The device production method of this invention comprises: a photothermal conversion layer-forming step of forming a photothermal conversion layer on a support; a light blocking layer-forming step of forming a light blocking layer on the photothermal conversion layer; an adhesive layer-forming step of forming an adhesive layer on the light blocking layer such that it covers the side surface of the light blocking layer; a flexible substrate-forming step of forming a flexible substrate on the adhesive layer; a device-forming step of forming a device element on the flexible substrate at least through a step involving treatment with an acid or an alkali; a photothermal conversion layer detachment step of irradiating the photothermal conversion layer with light, thereby detaching the support from the other layers; and an adhesive layer separation step of separating the adhesive layer from the flexible substrate. Thus, when the photothermal conversion layer is irradiated with light to decompose the photothermal conversion layer and thereby detach the support, the light blocking layer blocks light leaking into the device element side, thereby protecting the device. In addition, because the adhesive layer covers the side surface of the light blocking layer to protect the light blocking layer, deterioration of the light blocking layer can be prevented even when the substrate is subjected to treatment with an acid or an alkali in the production of the device element. The device production method of this invention can thus successfully produce a device comprising the flexible substrate which is likely to bend or break, and a thin device formed on the substrate.

In a preferred embodiment of the device production method of the present invention, in the adhesive layer-forming step, the adhesive layer is formed such that it further covers the side surface of the photothermal conversion layer.

Because the adhesive layer is formed such that it further covers the side surface of the photothermal conversion layer according to this embodiment, deterioration of the photothermal conversion layer can be prevented when the substrate is treated with an acid or an alkali in the production of the device. The device production method of this embodiment can thus more successfully produce a device comprising the flexible substrate which is likely to bend or break, and a thin device element formed on the substrate.

In a preferred embodiment of the device production method of the present invention, in the light blocking layer-forming step, the light blocking layer is formed by vapor deposition of aluminum.

According to this embodiment, the light blocking layer is formed by vapor deposition of aluminum in the light blocking layer-forming step. When the photothermal conversion layer is irradiated with light to decompose the photothermal conversion layer and thereby detach the support, such light blocking layer can more effectively block light leaking into the device element side. On the other hand, such light blocking layer is relatively easily deteriorated by treatment with an acid or an alkali in the production of the device. Protecting the side surface of the light blocking layer with the adhesive layer is therefore of more significance.

In a preferred embodiment of the device production method of the present invention, the method further comprises a focus position-indicating mark-forming step of forming on the support a focus position-indicating mark for focusing light onto the photothermal conversion layer.

According to this embodiment, the device production method further comprises the focus position-indicating mark-forming step of forming on the support a focus position-indicating mark for focusing light onto the photothermal conversion layer. Accordingly, when the photothermal conversion layer is irradiated with light to decompose the photothermal conversion layer and thereby detach the support, the photothermal conversion layer can be more securely irradiated with light. This can reduce leakage of light into the device side, enabling enhanced protection of the device.

In a preferred embodiment of the device production method of the present invention, in the flexible substrate-forming step, a glass substrate is used as the flexible substrate, a region in which the device element is not to be formed is provided in a peripheral area of the flexible substrate, and a cut that is to surround the device element is provided in the region of the flexible substrate.

According to this embodiment, a glass substrate is used as the flexible substrate, a region in which the device is not to be formed is provided in a peripheral area of the flexible substrate, and a cut that surrounds a region in which a device element is to be formed is provided in the non-device region of the flexible substrate. Accordingly, in the case where the flexible substrate is a thin glass substrate which is likely to break and a microcrack is present in a peripheral area of the substrate, if the microcrack grows into a crack e.g. due to thermal strain during a production process, the progress of cracking may be halted by the cut. In addition, detachment of the adhesive layer can be facilitated by detaching the adhesive layer after breaking the cut portion.

In a preferred embodiment of the device production method of the present invention, the device element formed on the substrate is one of an organic EL device, an organic transistor device and a solar cell device.

Because the device element is one of an organic EL device, an organic transistor device and a solar cell device according to this embodiment, the device tends to be deteriorated by leaking light when irradiating the photothermal conversion layer with light for detachment of the support. Further, an acid or alkali treatment step is needed for fine processing in the production of the device element. Thus, the present invention is applied with more significance to such a device element.

As described above, the laminate of the present invention can successfully produce a thin device element on a flexible substrate which is likely to bend or break.

The preparatory support of the present invention can provide the laminate which can successfully produce a thin device element on a flexible substrate which is likely to bend or break.

The laminate production method of the present invention can successfully produce a thin device element on a flexible substrate which is likely to bend or break.

Further, the device production method of the present invention can successfully produce a device comprising a flexible substrate which is likely to bend or break, and a thin device element formed on the substrate.

DETAILED DESCRIPTION OF THE PREFERRED EMBODIMENTS

Preferred embodiments of the present invention will now be described in detail. It should be understood, however, that the present invention is not limited to the following embodiments, but is capable of various modifications within the inventive concept.

[Laminate]

Figure 1:
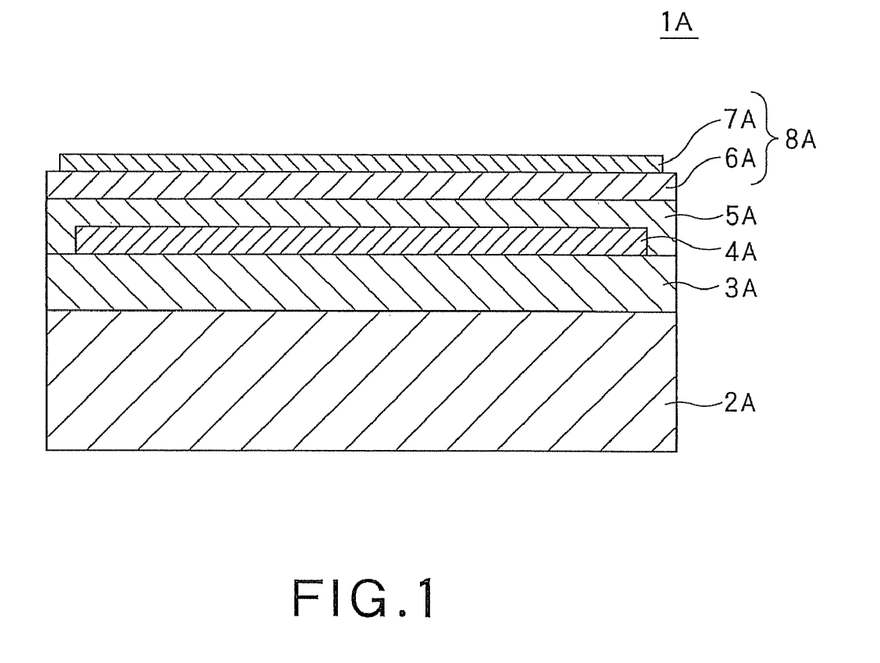
FIG. 1 is a schematic cross-sectional view showing an exemplary laminate according to the present invention.

FIG. 1 is a schematic cross-sectional view showing an exemplary laminate according to the present invention.

The laminate 1A includes a support 2A, a photothermal conversion layer 3A provided on the support 2A, a light blocking layer 4A formed on the photothermal conversion layer 3A, an adhesive layer 5A formed on the light blocking layer 4A, a flexible substrate 6A formed on the adhesive layer 5A, and a device (device element) 7A formed on the flexible substrate 6A. The support 2A can be detached from the other layers by irradiating the photothermal conversion layer 3A with light and, in addition, the adhesive layer 5A is formed such that it covers the side surface of the light blocking layer 4A. Accordingly, when the photothermal conversion layer 3A is irradiated with light to decompose the photothermal conversion layer 3A and thereby detach the support 2A, the light blocking layer 4A blocks light leaking into the device 7A side, thereby protecting the device 7A. In addition, because the adhesive layer 5A covers the side surface of the light blocking layer 4A to protect the light blocking layer 4A, deterioration of the light blocking layer 4A can be prevented even when the substrate is subjected to treatment with an acid or an alkali in the production of the device 7A. The laminate 1A can thus successfully produce the thin device 7A on the flexible substrate 6A which is likely to bend or break.

The laminate 1A is used to facilitate the production of a device 8A comprising the flexible substrate 6A, and the device (device element) 7A formed on the substrate. The flexible substrate 6A is thin and therefore is likely to bend, or is rigid and thin, and therefore is likely to break. Therefore, the flexible substrate 6A, as it is, is difficult to handle when producing the device 8A, making it difficult to form the device 7A on the substrate 6A. By fixing the flexible substrate 6A on the support 2A via the photothermal conversion layer 3A, the light blocking layer 4A and the adhesive layer 5A, deflection, warpage and breakage of the flexible substrate 6A can be prevented, which facilitates the formation of the device 7A. After the device 7A is formed on the flexible substrate 6A, and thus the device 8A is formed, the photothermal conversion layer 3A is irradiated with light, such as laser light, to decompose the material constituting the photothermal conversion layer 3A, thereby detaching the support 2A. Thereafter, the photothermal conversion layer 3A, the light blocking layer 4A and the adhesive layer 5A, remaining on the flexible substrate 6A, are removed to obtain the device 8A. The details of the device 8A production method will be described later.

Though the laminate 1A is composed of the support 2A, the photothermal conversion layer 3A, the light blocking layer 4A, the adhesive layer 5A, the flexible substrate 6A and the device 7A, it is also possible to insert some other layer(s) in the laminate. The respective layers constituting the laminate 1A will now be described.

No particular limitation is placed on the support 2A insofar as it has such a thickness and rigidity as to fix the flexible substrate 6A and facilitate the production of the device 8A. In order to ensure a requisite level of rigidity for the support 2A, it is preferred to use an acrylic resin, a polyolefin resin, a polyester resin, or glass as a material for the support 2A. Depending on the type of the device 7A to be produced, the support 2A is required to have a certain level of heat resistance. For the support 2A having such a heat resistance, it is preferred to use a material having a strain point of not less than 350° C., more preferably not less than 500° C. Further, the material constituting the support 2A preferably has a certain level of chemical resistance, because the device 7A is produced at least through a step involving treatment with an acid or an alkali. Such a material can be exemplified by glass, preferably quartz glass, soda glass, or the like. Commercially available glasses include Pyrex (registered trademark), Tempax (registered trademark) and Corning #1737 and #7059.

Considering the possibility of repeated use, the support 2A preferably has a certain level of scratch resistance. For repeated use of the support 2A, the support 2A preferably also has a certain level of light resistance so that the support 2A is less deteriorated by light irradiating the photothermal conversion layer 3A. Also from this viewpoint, it is preferred to use glass as a material for the support 2A.

Since the photothermal conversion layer 3A is irradiated with light for detachment of the support 2A, the support 2A is preferably permeable to the irradiating light. Thus, the support 2A generally has a light permeability of not less than 50%. When a UV curable resin is used for the photothermal conversion layer 3A or the adhesive layer 5B, the support 2A is preferably permeable to ultraviolet light.

The support 2A may have undergone surface treatment e.g. with a silane coupling agent to enhance the adhesion to the adjacent photothermal conversion layer 3A. Though not shown in FIG. 1, it is possible to provide an adhesive layer, such as a primer layer, between the support 2A and the photothermal conversion layer 3A.

The support 2A preferably has a thickness sufficient to facilitate handling of the flexible substrate 6A. From this viewpoint, the thickness of the support 2A is generally not less than 0.1 mm, preferably not less than 0.5 mm, and generally not more than 5 mm, preferably not more than 1.5 mm. Further, in order to successfully form the device 7A on the flexible substrate 6A, the variation in the thickness of the support 2A is preferably made within the range of ±2 µm.

The photothermal conversion layer 3A may be formed using a material which decomposes when irradiated with light. Though any light may be used within the concept of the present invention, it is preferred to use laser light from the viewpoint of ensuring a certain level of intensity. Laser light having a wavelength of 300 to 2000 nm is generally used. Specific examples of such laser light include YAG laser light (wavelength 1064 nm), second-harmonic YAG laser light (wavelength 532 nm), and semiconductor laser light (wavelength 780-1300 nm). From the viewpoint of decomposition by light irradiation, the photothermal conversion layer 3A generally contains a light absorbing agent and a heat decomposable resin. The radiation energy of e.g. laser light is absorbed by the light absorbing agent and converted into heat energy. The heat energy then rapidly raise the temperature of the photothermal conversion layer 3A and, when the temperature reaches the heat decomposition temperature of the heat decomposable resin (organic component), the heat decomposable resin thermally decomposes (carbonizes). A gas generated by the heat decomposition creates a void layer in the photothermal conversion layer 3A, whereby the photothermal conversion layer 3A is separated into two. Consequently, the support 2A can be detached.

No particular limitation is placed on a light absorbing agent for use in the photothermal conversion layer 3A insofar as it can absorb the radiation energy of irradiating light. Examples of light absorbing agents, which can be used when laser light is used as irradiating light, include carbon black powder; graphite powder; powder of a metal, such as iron, aluminum, copper, nickel, cobalt, manganese, chromium, zinc or tellurium; powder of a metal oxide such as black titanium oxide; and dyes or pigments such as an aromatic diamino metal complex, an aliphatic diamine metal complex, an aromatic dithiol metal complex, a mercaptophenol metal complex, a squarylium compound, a cyanine dye, a methine dye, a naphthoquinone dye, an anthraquinone dye, etc. The light absorbing agent contained in the photothermal conversion layer 3A may have the form of a film, such as an evaporated metal film. From the viewpoint of facilitating the separation of the photothermal conversion layer 3A, it is preferred to use carbon black as the light absorbing agent. Though a light absorbing agent of any particle size may be used within the concept of the present invention, the particle size is generally not less than 1 nm and not more than 1 μm.

No particular limitation is placed on the content of the light absorbing agent in the photothermal conversion layer 3A within the concept of the present invention. For example, when carbon black is used as the light absorbing agent, the content is generally not less than 5% by volume and not more than 70% by volume. This content range can facilitate decomposition of the heat decomposable resin while securing the adhesiveness of the photothermal conversion layer 3A.

No particular limitation is placed on a heat decomposable resin for use in the photothermal conversion layer 3A insofar as it decomposes thermally at a predetermined temperature. Examples of the heat decomposable resin include gelatin, cellulose, a cellulosic ester (e.g. cellulose acetate, nitrocellulose), polyphenol, polyvinyl butyral, polyvinyl acetal, polycarbonate, polyurethane, polyester, polyortho ester, polyacetal, polyvinyl alcohol, polyvinyl pyrrolidone, a copolymer of vinylidene chloride and acrylonitrile, poly(meth)acrylate, polyvinyl chloride, a block copolymer containing silicone resin and/or polyurethane units, etc. These resins may be used either singly or as a mixture of two or more. In order to prevent re-adhesion of the photothermal conversion layer 3A which has been separated through the heat decomposition of the heat decomposable resin and the formation of void layer, the heat decomposable resin preferably has a glass transition temperature (Tg) of not less than room temperature (20° C.), more preferably not less than 100° C.

When glass is used for the support 2A, to increase the adhesion between the support 2A (glass) and the photothermal conversion layer 3A, the heat decomposable resin for use in the photothermal conversion layer 3A preferably has in the molecule a polar group (e.g. —COOH or —OH) capable of forming a hydrogen bond with a silanol group on the glass surface. Further, since the device 7A is produced at least through a step involving treatment with an acid or an alkali, it is preferred to impart chemical resistance to the photothermal conversion layer 3A. From this viewpoint, it is possible to use a heat decomposable resin having in the mole a functional group capable of self-crosslinking by heat treatment, or a heat decomposable resin (UV curable resin) or a precursor thereof (e.g. a monomer/oligomer mixture), which is capable of being crosslinked by irradiation with ultraviolet light or visible light. Further, when adhesiveness is imparted to the photothermal conversion layer 3A, an adhesive polymer, e.g. based on poly(meth)acrylate, may be used as the heat decomposable resin.

The photothermal conversion layer 3A may optionally contain a certain amount of filler. The filler acts to prevent re-adhesion of the photothermal conversion layer 3A which has been separated through the heat decomposition of the heat decomposable resin and the formation of void layer. Examples of the filler include silica, talc, barium sulfate, etc.

The photothermal conversion layer 3A may further contain other additives. For example, when the heat decomposable resin is applied in the form of a monomer or oligomer, followed by polymerization or curing to form the photothermal conversion layer 3A, a photopolymerization initiator may be used as an additive. A coupling agent to enhance the adhesion between the support 2A and the photothermal conversion layer 3A, a crosslinking agent to enhance the chemical resistance, etc. may also be used as an additive. Further, a low temperature gas-forming agent may be used as an additive to promote separation of the photothermal conversion layer 3A through its decomposition. The low temperature gas-forming agent can be typified by a foaming agent and a sublimating agent. Examples of the foaming agent include sodium hydrogen carbonate, ammonium carbonate, ammonium hydrogen carbonate, zinc carbonate, azodicarbonamide, azobisisobutyronitrile, N,N'-dinitrosopentamethylene tetramine, p-toluenesulfonyl hydrazine, p,p-oxybis (benzenesulfohydrazide), etc. Examples of the sublimating agent include 2-diazo-5,5-dimethylcyclohexane-1,3-dione, camphor, naphthalene, borneal, butylamide, valeramide, 4-tert-butylphenol, furan-2-carboxylic acid, succinic anhydride, 1-adamantanol, 2-adamantanon, etc.

Though no limitation is placed on the thickness of the photothermal conversion layer 3A insofar as it enables the detachment of the support 2A, it is generally not less than 0.1 μm, preferably not less than 0.3 μm, more preferably not less than 0.5 μm, and generally not more than 5 μm, preferably not more than 3 μm, more preferably not more than 2 μm. The photothermal conversion layer 3A having such a thickness can sufficiently absorb light, can have light permeability and can be easily separated.

The light blocking layer 4A is used to prevent light, applied to the photothermal conversion layer 3A to decompose it, from leaking into the device 7A side and deteriorating the device 7A. In particular, when the device 7A is an organic EL device or an organic transistor device, the device 7A contains an organic compound. Because an organic compound is weak against light and heat, it is possible that the organic compound in the device 7A may be decomposed or deteriorated by the radiation energy of leaking light. The light blocking layer 4A is used to reflect or absorb light that has passed through the photothermal conversion layer 3A.

The light blocking layer 4A generally functions to reflect light or absorb light. When the light blocking layer 4A is made to function as a light reflecting layer, the light blocking layer 4A is preferably formed of a metal. Examples of the metal include aluminum, copper, iron, gold, silver, chromium, titanium, etc. An alloy of the metals may also be used; the atomic ratio of the alloy may be arbitrarily determined within the concept of the present invention. Of these materials, aluminum, gold, silver, chromium or titanium is preferably used from the viewpoints of low production cost, ease in handling upon industrial production, and deterioration by treatment with an acid or an alkali in the production of the device 7A; and aluminum is most preferably used. Thus, the light blocking layer 4A preferably functions as a light reflecting layer. Further, the light blocking layer 4A is preferably formed of aluminum. When the photothermal conversion layer 3A is irradiated with light to decompose the photothermal conversion layer 3A and thereby detach the support 2A, such light blocking layer 4A can more effectively block light leaking into the device 7A side. On the other hand, such light blocking layer 4A is relatively easily deteriorated by treatment with an acid or an alkali in the production of the device 7A. Protecting the side surface of the light blocking layer 4A with the adhesive layer 5A is therefore of more significance.

When the light blocking layer 4A is made to function as a light absorbing layer, a material may be used which is capable of absorbing light irradiating the photothermal conversion layer 3A. When YAG laser light is used as the irradiating light, an infrared absorbing material such as a diimmonium salt compound, for example, can be used. When semiconductor laser light is used as the irradiating light, a phthalocyanine dye, a cyanine dye, or the like can be used. The light blocking layer 4A can be formed by using such an infrared absorbing material or dye in the form of an evaporated film, or by dispersing such a material in a resin and forming a film of the dispersion.

The light blocking layer 4A may also contain any additive in any amount within the concept of the present invention.

The thickness of the light blocking layer 4A may be such as to effectively reflect or absorb light leaking from the photothermal conversion layer 3A, and is generally not less than 5 nm and not more than 5 μm.

As shown in FIG. 1, the adhesive layer 5A is formed such that it covers the side surface of the light blocking layer 4A. Even when the device 7A is produced at least through a step involving treatment with an acid or an alkali, the adhesive layer 5A covering the side surface of the light blocking layer 4A prevents intrusion of an acid or an alkali into the light blocking layer 4A, thereby preventing deterioration of the light blocking layer 4A.

The adhesive layer 5A is used to fix the flexible substrate 6A to the support 2A via the photothermal conversion layer 3A. After irradiating the photothermal conversion layer 3A with light, thereby decomposing the photothermal conversion layer 3A and detaching the support 2A from the laminate, the adhesive layer 5, the light blocking layer 4A and the residual photothermal conversion layer 3A remain attached to the flexible substrate 6A (device 8A). Therefore, the adhesive layer 5A is generally formed of a material that can be easily peeled from the flexible substrate 6A. Thus, the adhesive layer 5A is formed by using a material which, while having an adhesive power necessary to fix the flexible substrate 6A to the support 2A, can be easily peeled from the flexible substrate 6A. Examples of such a material include a rubber adhesive, such as a rubber or an elastomer, an epoxy- or urethane-based one-component thermosetting adhesive, an epoxy-, urethane- or acrylate-based two-component reactive adhesive, a hot-melt adhesive, an acrylate- or epoxy-based ultraviolet (UV) or electron beam curable adhesive, an aqueous dispersion adhesive, etc. Of these, a UV curable adhesive is preferred from the viewpoint of high coating uniformity, etc. The UV curable resin preferably is an acrylic resin, and more preferably is an adhesive comprising an oligomer, having a polymerizable vinyl group such as urethane acrylate, epoxy acrylate or polyester acrylate, and/or a acrylic or methacrylic monomer, and containing a photopolymerization initiator and optionally an additive(s). Examples of the additive include a thickener, a plasticizer, a dispersant, a filler other than the above-described filler, a flame retardant, a heat aging inhibitor, etc.

It is also possible to use a double faced adhesive tape as the adhesive layer 5A. A common double faced adhesive tape is comprised of a film having an adhesive layer on both sides thereof. An adhesive usable for the adhesive layer generally comprises an acrylate, a urethane, a natural rubber, or the like as a main component, and optionally contains a crosslinking agent. A preferable adhesive comprises a copolymer based on 2-ethylhexyl acrylate or butyl acrylate. Paper or a plastic film is used as the film of a double faced adhesive tape. The film preferably has flexibility so that the adhesive layer 5A can be easily peeled from the flexible substrate 6A.

Though no particular limitation is placed on the thickness of the adhesive layer 5A within the concept of the present invention, it is generally not less than 10 μm, preferably not less than 20 μm, and generally not more than 150 μm, preferably not more than 100 μm.

A substrate which is thin and flexible, and therefore is likely to bend (e.g. a plastic substrate or a plastic film), or a substrate which is rigid and thin, and therefore is likely to break (e.g. a glass substrate) may be used as the flexible substrate 6A. Thus, the flexible substrate 6A is a substrate which needs to be fixed on the rigid support 2A to produce the device 7A on the substrate.

When the flexible substrate 6A is a plastic substrate or film, examples of the plastic material (resin material) include polyethylene terephthalate (PET), polyethylene naphthalate (PEN), polycarbonate (PC), polyether sulfone (PES), polyimide (PI), polyetherimide (PEI), cyclopolyolefin (CPO), polyarylate (PAR), polypropylene (PP), polyamide (PA), etc. For display applications, for example, where transparency and some heat resistance are required, it is preferred to use polyethylene terephthalate (PET), polyethylene naphthalate (PEN), polycarbonate (PC), polyether sulfone (PES), transparent polyimide (PI), cyclopolyolefin (CPO) or polyarylate (PAR). A desired mixture of two or more of the above resin materials, blended in an arbitrary proportion, may be used within the concept of the present invention.

When the flexible substrate 6A is a glass substrate, the substrate preferably is a thin glass. The same material as described above with reference to the support 2A can be used for the thin glass.

The flexible substrate 6A preferably is transparent. This allows the flexible substrate 6A to be provided on the side of a light-emitting face or an image face of a display device, such as an organic EL display device. More specifically, the flexible substrate 6A preferably has an average light transmittance of not less than 80% e.g. in the range of 400 to 700 nm. The light transmittance is affected by the material and the thickness of the flexible substrate 6A, and therefore these factors are taken into consideration in the design of the flexible substrate 6A.

The flexible substrate 6A may be subjected to surface treatment, such as corona treatment, flame treatment, plasma treatment, glow discharge treatment, surface roughening, heat treatment, chemical treatment, treatment to improve adhesiveness, etc. Such a surface treatment may be carried out by a conventionally known method.

From the viewpoint of flexibility and shape retention, the thickness of the flexible substrate 6A is generally not less than 10 μm, preferably not less than 50 μm, and generally not more than 5 mm, preferably not more than 3 mm, more preferably not more than 1 mm, further more preferably not more than 500 μm, most preferably not more than 200 μm.

There is no particular limitation on the device (device element) 7A though it is preferably produced at least through a step involving treatment with an acid or an alkali. An organic EL device, an organic transistor device or a solar cell device is preferably used as such a device 7A. Such a device 7A tends to be deteriorated by leaking light when irradiating the photothermal conversion layer 3A with light for detachment of the support 2A. Further, an acid or alkali treatment step is needed for fine processing in the production of such device 7A. Thus, the present invention is applied with more significance to such device 7A.

When the device 7A is an organic EL device, an organic transistor device or a solar cell device, the components may be those known in the art. For example, when the device 7A is an organic EL device, the organic EL device is basically composed of an anode, a hole transport layer, a light-emitting layer, and a cathode. The material, thickness, etc. of each component may be those known in the art. A sealing substrate may be attached to the device 7A to prevent deterioration of the device performance due to moisture adsorption. In the case of an organic EL device, after forming a cathode, a gas barrier film as a sealing substrate may be attached to the organic EL device e.g. with an adhesive such that the film covers the device. A thermosetting adhesive or an ultraviolet (UV) curable adhesive can be used as the adhesive. The adhesive can be applied to the entire surface of the organic EL device, or applied in a frame-like pattern onto the flexible substrate 6A in its area around the organic EL device. Though not shown in FIG. 1, interconnects may be connected to the device 7A.

When an organic EL device is used as the device 7A, treatment with an acid or an alkali is requisite in the manufacturing process. In particular, acid etching is carried out upon patterning of an electrode, such as an ITO electrode, or an auxiliary electrode. An alkali treatment is carried out upon resist patterning in the formation of an insulating layer. Further, alkali development is carried out for the formation of a cathode separator. Therefore, in order to prevent deterioration of the photothermal conversion layer 4A by such a treatment with an acid or an alkali, the side surface of the photothermal conversion layer 4A is covered with the adhesive layer 5A.

The device 7A is a thin device. Accordingly, the device 8A, consisting of the device 7A and the flexible substrate 6A, is also a thin device. The thickness of the thin device 7A is generally not less than 5 nm and not more than 5 mm.

As can be seen from FIG. 1, the light blocking layer 4A is not formed over the entire area of the photothermal conversion layer 3A in the laminate 1A. Accordingly, when the photothermal conversion layer 3A is irradiated with light, the light may leak from the peripheral portion of the photothermal conversion layer 3A on which the light blocking layer 4A is not formed, and the leaking light can deteriorate the peripheral portion of the device 7A. In industrial production, however, such a peripheral portion of the device 7A is not used as an effective area. Thus, the leakage of light does not cause any significant problem.

Figure 2:
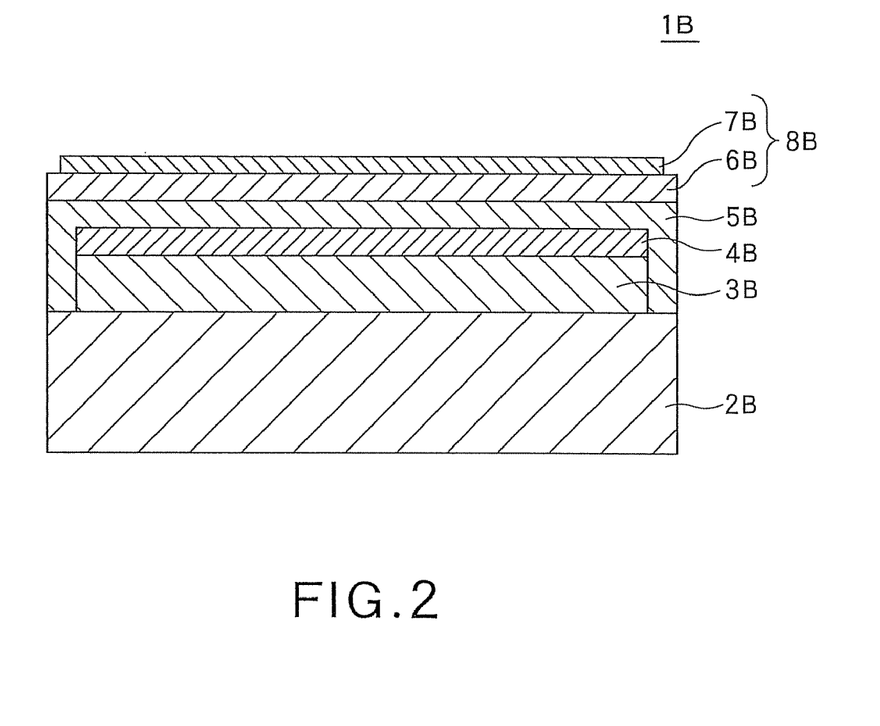
FIG. 2 is a schematic cross-sectional view showing another exemplary laminate according to the present invention.

FIG. 2 is a schematic cross-sectional view showing another exemplary laminate according to the present invention.

The laminate 1B has the same construction as the laminate 1A except that the adhesive layer 5B is formed such that it further covers the side surface of the photothermal conversion layer 3B. Thus, the peripheral portion of the adhesive layer 5B covers the side surfaces of the light blocking layer 4B and the photothermal conversion layer 3B, and reaches to the support 2B. This can prevent deterioration of the photothermal conversion layer 3B when the substrate is treated with an acid or an alkali in the production of the device (device element) 7B. The laminate 1B can thus more successfully produce the thin device 7B on the flexible substrate 6B which is likely to bend or break.

Since the laminate 1B has the same construction as the laminate 1A except for the above-described respect, a description of the other construction of the laminate 1B is omitted to avoid redundancy.

Figure 3:
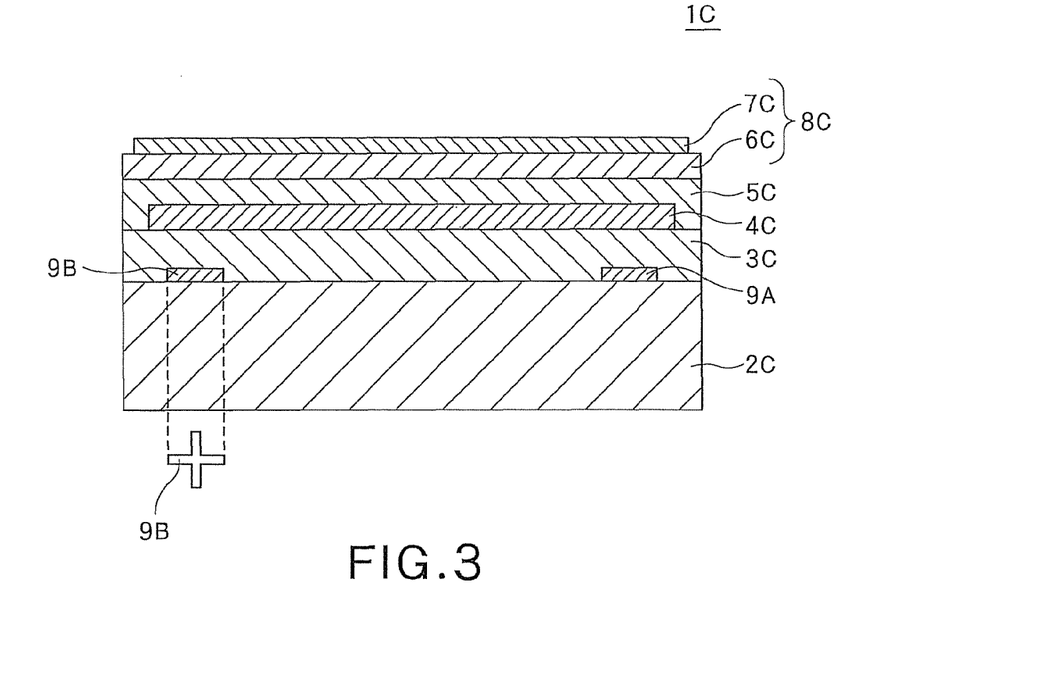
FIG. 3 is a schematic cross-sectional view showing yet another exemplary laminate according to the present invention.

FIG. 3 is a schematic cross-sectional view showing yet another exemplary laminate according to the present invention.

The laminate 1C has the same construction as the laminate 1A except that focus position-indicating marks 9A, 9B for focusing light onto the photothermal conversion layer 3C is provided on the support 2C. Thus, the laminate 1C is the same as the laminate 1A in that it includes the support 2C, the photothermal conversion layer 3C, the light blocking layer 4C, the adhesive layer 5C, the flexible substrate 6C and the device 7C, and that the device 8C is composed of the flexible substrate 6C and the device (device element) 7C, but differs from the laminate 1A in that it has the focus position-indicating marks 9A, 9B on the support 2C. Owing to the use of the focus-position indicating marks 9A, 9B, when the photothermal conversion layer 3C is irradiated with light to decompose the photothermal conversion layer 3C and thereby detach the support 2C, the photothermal conversion layer 3C can be more securely irradiated with light. This can reduce leakage of light into the device 7C side, enabling enhanced protection of the device 7C.

The significance of the provision of the focus-position indicating marks 9A, 9B in the laminate 1C will now be described.

In the laminate 1C, when the device 7C is a large-sized device, the flexible substrate 6C must also be a large-sized substrate, which is more likely to bend, warp or break. It is therefore more difficult to keep the flexible substrate 6C in a horizontal position during the production of the laminate 1C; and air bubbles can form at the interface between the adhesive layer 5C and the flexible substrate 6C when bonding them together. Though the adhesive layer 5C and the flexible substrate 6C should ideally be bonded together without the generation of air bubbles, it is practically impossible to avoid the generation of bubbles when the flexible substrate 6C is large-sized and therefore is difficult to handle. It has been found through the present inventors' studies that when the photothermal conversion layer 3C is irradiated with light to decompose the photothermal conversion layer 3C and thereby detach the support 2C, leakage of light can occur at the site of bubble generation despite the presence of the light blocking layer 4C, resulting in destruction of the device 7C. In particular, when an organic EL device is used as the device 7C, there exists a non-luminous region in a pixel constituting the organic EL device.

It is not clear at present by which mechanism the generation of air bubbles in the laminate 1C, associated with the use of a large-sized device 7C, causes destruction of the device 7C. However, in view of the confirmed fact that the device 7A is destroyed when the photothermal conversion layer 3C is irradiated with laser light (YAG laser light) twice to securely decompose the photothermal conversion layer 3C, the following mechanism is conceivable: The adhesive layer 5C is considered to be relatively thin in a region where air bubbles are present, because of the presence of the bubbles. Because of the relatively small thickness, the rigidity is poor in the region where air bubbles are present (thin region of the adhesive layer 5C). Therefore, upon the first irradiation of the photothermal conversion layer 3C with laser light, the heat decomposable resin in the photothermal conversion layer 3C thermally decomposes and generates a gas, and the gas will produce a crack in the light blocking layer 4C in its region corresponding to the region where the bubbles are present. Upon the second irradiation of the photothermal conversion layer 3C with laser light, the irradiating light begins to leak from the crack of the light blocking layer 4C into the device 7C side, resulting in destruction of the device 7C in its region corresponding to the region where the bubbles are present.

The above-described mechanism is conceivable for destruction of the device 7C upon the light irradiation, due to the generation of air bubbles, in the laminate 1C. It has also been found by the present inventors that the destruction of the device 7C can be effectively prevented by focusing light onto the photothermal conversion layer 3C when irradiating the photothermal conversion layer 3C with the light, thereby minimizing the amount of light that reaches the light blocking layer 4C. Therefore, in the laminate 1C, the support 2C is provided with the focus-position indicating marks 9A, 9B. Before carrying out irradiation of the photothermal conversion layer 3C with light, light is focused on the focus-position indicating marks 9A, 9B.

As shown in FIG. 3, the focus-position indicating marks 9A, 9B are provided near the periphery of the support 2C in the laminate 1C; however, it is possible to provide focus-position indicating marks at other locations on the support 2C. The focus-position indicating marks 9A, 9B are each cross-shaped as shown by the descriptive plan view of the mark 9B in FIG. 3. However, the focus-position indicating marks 9A, 9B are used exclusively for focusing, and therefore their shape is not limited to a cross shape. A metal, an inorganic material or an organic material can be used as a material for the focus-position indicating marks 9A, 9B. Aluminum is typically used as a metal material for the focus-position indicating marks 9A, 9B; glass is typically used as an organic material; and a thermosetting resin or an ultraviolet (UV) curable resin is typically used as an organic material. The thickness of the focus-position indicating marks 9A, 9B is generally not less than 10 nm and not more than 2000 nm. Though not shown in FIG. 3, when the support 2C is formed of glass, it is possible to process the support 2C to thereby form a focus-position indicating mark(s) on the surface of the support 2C. In this case, the depth of the focus-position indicating mark(s) is generally not less than 10 nm and not more than 2000 nm. Thus, the provision of a focus-position indicating mark(s) on a support according to the present invention includes the case where the focus-position indicating mark(s) is formed in the support by processing of the support.

Since the laminate 1C has the same construction as the laminate 1A except for the above-described respect, a description of the other construction of the laminate 1C is omitted to avoid redundancy.

Figure 4:
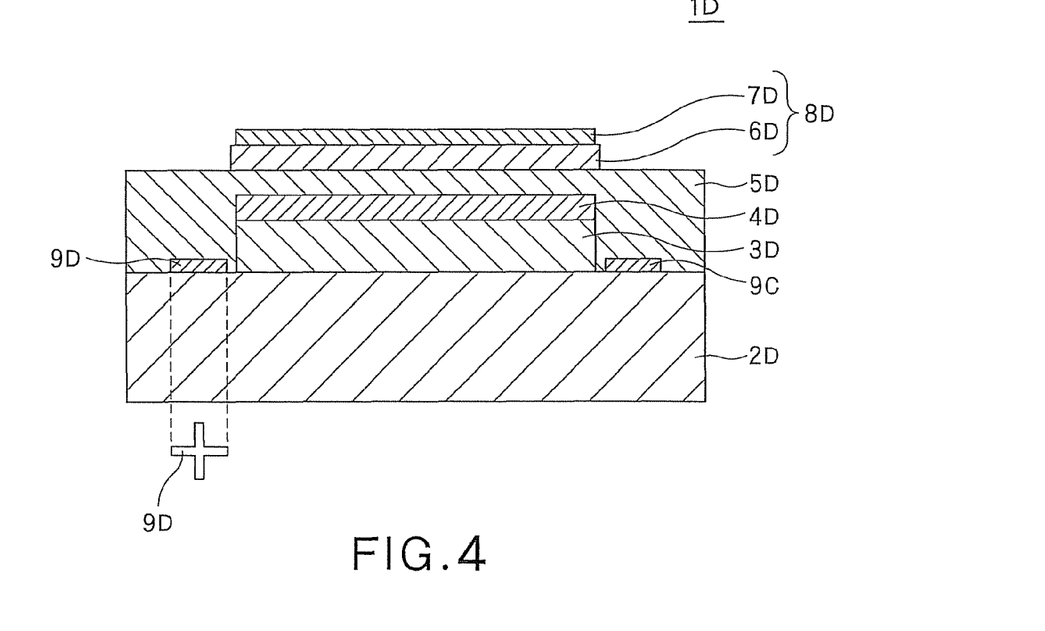
FIG. 4 is a schematic cross-sectional view showing yet another exemplary laminate according to the present invention.

FIG. 4 is a schematic cross-sectional view showing yet another exemplary laminate according to the present invention.

The laminate 1D has the same construction as the laminate 1C in that the focus position-indicating marks 9C, 9D for focusing light onto the support 2D are provided, but differs from the laminate 1C in that the photothermal conversion layer 3D and the light blocking layer 4D are not present over the focus position-indicating marks 9C, 9D, and that the adhesive layer 5D is formed such that it covers the side surfaces of the photothermal conversion layer 3D and the light blocking layer 4D. Thus, the laminate 1D is the same as the laminate 1C in that it includes the support 2D, the photothermal conversion layer 3D, the light blocking layer 4D, the adhesive layer 5D, the flexible substrate 6D and the device (device element) 7D, and that the device 8D is composed of the flexible substrate 6D and the device 7D, but differs from the laminate 1C in that the focus position-indicating marks 9C, 9D formed on the support 2D are provided outside the photothermal conversion layer 3D and the light blocking layer 4D, and are covered with the adhesive layer 5D.

The construction of the laminate 1D is employed in the case where the photothermal conversion layer 3D is opaque, and therefore it is difficult to focus light on the focus position-indicating marks 9C, 9D if they are provided in the photothermal conversion layer 3D. In FIG. 4, the region on the support 2D where the photothermal conversion layer 3D and the light blocking layer 4D are not formed (region where the focus position-indicating marks 9C, 9D are formed) are depicted widely for illustrative purposes. In the actual laminate, however, the photothermal conversion layer and the light blocking layer are formed over almost the entire area of the support, while the focus position-indicating marks are formed in a very narrow peripheral region on the support (in the adhesive layer) where the photothermal conversion layer and the light blocking layer are not present.

Since the laminate 1D has the same construction as the laminate 1C except for the above-described difference, a description of the other construction of the laminate 1D is omitted to avoid redundancy.

Figure 5:
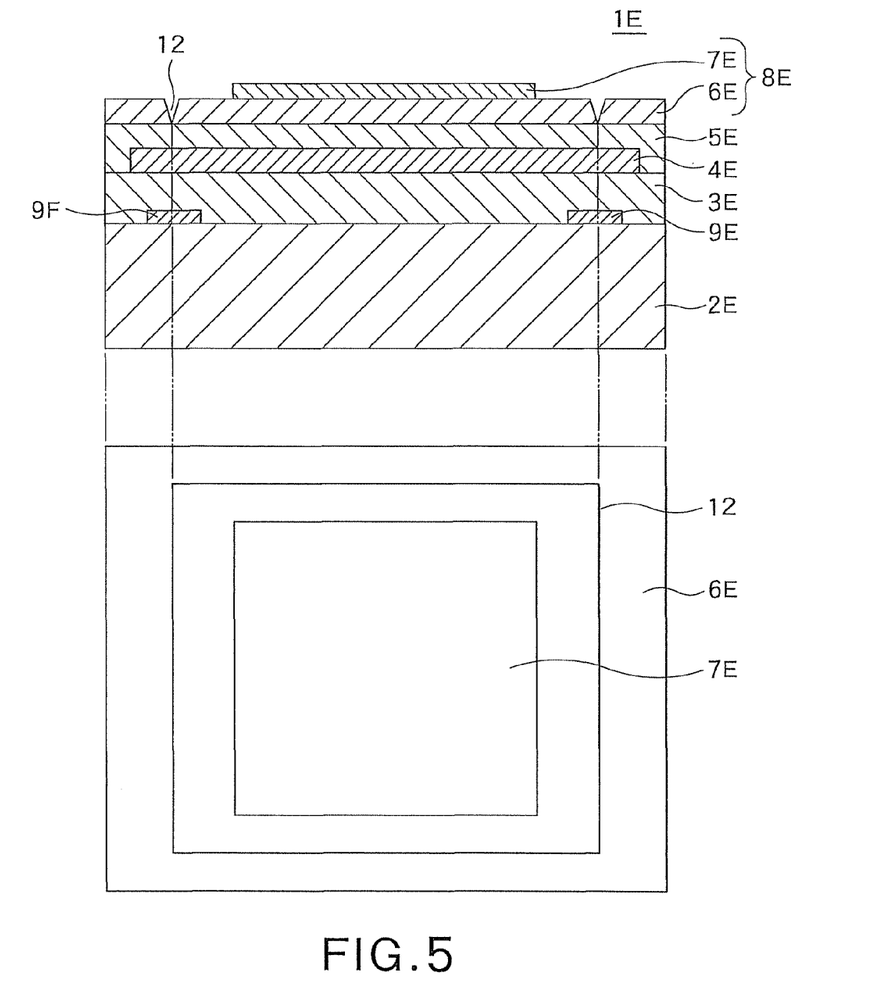
FIG. 5 is a schematic cross-sectional view and plan view showing yet another exemplary laminate according to the present invention.

FIG. 5 is a schematic cross-sectional view and plan view showing yet another exemplary laminate according to the present invention, the upper diagram being a schematic cross-sectional view of a laminate 1E and the lower diagram being a schematic plan view of the laminate 1E.

The laminate 1E uses a glass substrate as the flexible substrate 6E. Further, a region in which the device (device element) 7E is not formed is present in a peripheral area of the flexible substrate 6E, and a cut 12 that surrounds the device 7E is provided in the non-device region of the flexible substrate 6E. Accordingly, in the case where the flexible substrate 6E is a thin glass substrate which is likely to break and a microcrack is present in a peripheral area of the substrate, if the microcrack grows into a crack e.g. due to thermal strain during a production process, the progress of cracking may be halted by the cut 12. In addition, detachment of the adhesive layer 5E can be facilitated by detaching the adhesive layer 5E after breaking the cut portion.

The laminate 1E is the same as the laminate 1C in that it includes the support 2E, the photothermal conversion layer 3E, the light blocking layer 4E, the adhesive layer 5E, the flexible substrate 6E and the device 7E, and the device 8E is composed of the flexible substrate 6E and the device 7E, and that the focus position-indicating marks 9E, 9F are formed, as shown in the upper schematic cross-sectional diagram of FIG. 5, but differs from the laminate 1C in that it has a wide region where the device 7E is not formed in a peripheral area of the flexible substrate 6E and, as also shown in the lower diagram of FIG. 5, the cut 12 that surrounds the device 7E is provided in the non-device region. The cut 12 may be formed in the flexible glass substrate 6E e.g. with a glass cutter. Though in FIG. 5 the cut 12 is formed in a generally square pattern, there is no particular limitation on the pattern of the cut 12; for example, it may be formed in a star-like pattern or a circular pattern, or in a square pattern with round corners.

Since the laminate 1E has the same construction as the laminate 1C except for the above-described difference, a description of the other construction of the laminate 1E is omitted to avoid redundancy.

[Preparatory Support]

Figure 6:
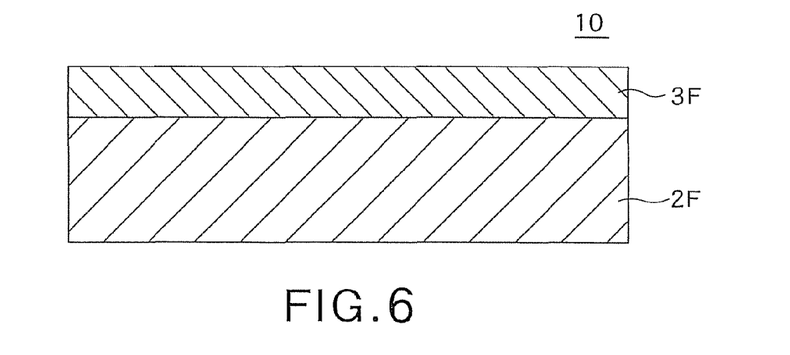
FIG. 6 is a schematic cross-sectional view showing an exemplary preparatory support according to the present invention.

FIG. 6 is a schematic cross-sectional view showing an exemplary preparatory support according to the present invention.

The preparatory support 10 is for use in the laminate 1 (any one of 1A to 1E) described hereinabove, and includes the support 2F and the photothermal conversion layer 3F provided on the support 2F. The preparatory support 10 can provide the laminate 1 which can successfully produce the thin device 7 on the flexible substrate 6 which is likely to bend or break.

Since the support 2F and the photothermal conversion layer 3F, constituting the preparatory support 10, have been described with reference the laminate 1, a description thereof is herein omitted to avoid redundancy.

[Laminate Production Method]

The laminate production method of the present invention, which is to produce the laminate of the present invention, includes a photothermal conversion layer-forming step of forming a photothermal conversion layer on a support; a light blocking layer-forming step of forming a light blocking layer on the photothermal conversion layer; an adhesive layer-forming step of forming an adhesive layer on the light blocking layer such that it covers the side surface of the light blocking layer; a flexible substrate-forming step of forming a flexible substrate on the adhesive layer; and a device-forming step of forming a device on the flexible substrate at least through a step involving treatment with an acid or an alkali. Thus, when the photothermal conversion layer is irradiated with light to decompose the photothermal conversion layer and thereby detach the support, the light blocking layer blocks light leaking into the device side, thereby protecting the device. In addition, because the adhesive layer covers the side surface of the light blocking layer to protect the light blocking layer, deterioration of the light blocking layer can be prevented even when the substrate is subjected to treatment with an acid or an alkali in the production of the device. The laminate production method of the present invention can thus successfully produce a thin device on the flexible substrate which is likely to bend or break.

The respective steps will now be described.

The photothermal conversion layer-forming step is a step of forming a photothermal conversion layer on a support. Materials for the support and the photothermal conversion layer have already been described with reference to the laminate. The photothermal conversion layer-forming step can be carried out, for example, by first preparing a photothermal conversion layer-forming coating liquid in which a light absorbing agent, such as carbon blacks, a heat decomposable resin and an additive (e.g. filler) are dissolved or dispersed in a solvent, and applying the coating liquid onto a support, followed by drying.

The photothermal conversion layer-forming step can also be carried out by using a curable resin as a heat decomposable resin. For example, when a UV curable resin is used as a heat decomposable resin, a resin precursor solution is prepared by mixing a light absorbing agent, a monomer or an oligomer as a material for a heat decomposable resin, an optional additive (s) such as a photopolymerization initiator, and an optional solvent. The resin precursor solution is applied onto a support, followed by drying and polymerization/curing, thereby forming a photothermal conversion layer.

No particular limitation is placed on a method for applying such a photothermal conversion layer-forming coating liquid or resin precursor solution. Examples of usable methods include spin coating, die coating, roll coating, screen coating, etc. The drying temperature and the drying time may be appropriately selected depending on the material used. When the heat decomposable resin used is an ultraviolet curable resin, the polymerization/curing can be performed by ultraviolet irradiation. In the case of a thermosetting resin, the polymerization/curing can be performed by heating.

The light blocking layer-forming step is a step of forming a light blocking layer on the photothermal conversion layer. A method for forming the light blocking layer may be appropriately selected depending on the material used. Materials for the light blocking layer have already been described with reference to the laminate. For example, when the light blocking layer is made to function as a light reflecting layer, the light blocking layer is preferably formed of a metal. In this case, the light blocking layer can be formed by PVD or CVD, such as vacuum vapor deposition, sputtering, ion plating, etc., or by screen printing using a metal paste. In the laminate 1A of FIG. 1, for example, the peripheral portion of the photothermal conversion layer 3A is not provided with the light blocking layer 4A. Such a construction can be obtained by restricting a forming area for the light blocking layer 4A e.g. with a mask. In particular, in the light blocking layer-forming step, the light blocking layer is preferably formed by vapor deposition of aluminum. When the photothermal conversion layer is irradiated with light to decompose the photothermal conversion layer and thereby detach the support, such an aluminum light blocking layer can more effectively block light leaking into the device side. On the other hand, such a light blocking layer is relatively easily deteriorated by treatment with an acid or an alkali in the production of a device. Protecting the side surface of the light blocking layer with an adhesive layer is therefore of more significance.

When the light blocking layer is made to function as a light absorbing layer, the light blocking layer can be formed by using in the light blocking layer-forming step a material which has the property of absorbing light irradiating the photothermal conversion layer, as described above with reference to the laminate. More specifically, the light blocking layer may be formed, for example, by forming a film of an infrared absorbing material or a dye on the photothermal conversion layer by vacuum vapor deposition. Alternatively, the light blocking layer may be formed, for example, by preparing a light blocking layer-forming coating liquid in which an infrared absorbing material or a dye is dispersed in a solution of a resin, applying the coating liquid onto the photothermal conversion layer, followed by drying. The application and the drying can be carried out in the same manner as described above with reference to the photothermal conversion layer-forming step.

The adhesive layer-forming step is a step of forming an adhesive layer on the light blocking layer such that it covers the side surface of the light blocking layer. The adhesive layer herein includes both that before curing/drying and that after curing/drying. Materials for the adhesive layer have already been described with reference to the laminate. As also described above, the adhesive layer is preferably formed in the adhesive layer-forming step such that it also covers the side surface of the photothermal conversion layer. This can prevent deterioration of the photothermal conversion layer when the substrate is treated with an acid or an alkali in the production of a device. The laminate production method of this embodiment can thus more successfully produce a device comprising the flexible substrate which is likely to bend or break, and a thin device formed on the substrate.

No particular limitation is placed on a method for forming the adhesive layer in the adhesive layer-forming step; however, in order to form the adhesive layer with a uniform thickness, an adhesive or the like for forming the adhesive layer is preferably in a liquid state upon application and bonding. The viscosity of the adhesive is preferably less than 10000 cps at a temperature upon application and bonding (e.g. 25° C.). The formation of the adhesive layer may be carried out by applying an adhesive, dissolved or dispersed in a solvent, or a liquid adhesive before curing onto the light blocking layer e.g. by spin coating, die coating, roll coating, flexographic printing, gravure printing or screen coating, or by using an application device such as a dispenser or an ink jet device. These application methods can form an adhesive layer having a uniform thickness at a high process speed, thus with high productivity.

An adhesive for use in the adhesive layer-forming step preferably has an elastic modulus of not less than 100 MPa at 25° C., and not less than 10 MPa at 50° C., under conditions of practical use after removal of a solvent in the case of a solvent-based adhesive, after curing in the case of a curable adhesive, or after solidification at room temperature in the case of a hot-melt adhesive. Such an adhesive layer is unlikely to become distorted.

The flexible substrate-forming step is a step of forming a flexible substrate on the adhesive layer. Any of those substrates described above with reference to the laminate may be used as the flexible substrate. Examples of such substrates include a plastic substrate, a plastic film and a thin glass.

The flexible substrate-forming step can be carried out, for example, by placing the flexible substrate on the adhesive layer (coating liquid) before drying/curing of the adhesive layer, and then drying/curing the adhesive layer. When placing the flexible substrate on the uncured adhesive layer, careful attention must be paid to prevent the formation of air bubbles between the flexible substrate and the uncured adhesive layer. More specifically, a bonding method can be used in which the flexible substrate is brought into contact with the adhesive layer under vacuum while keeping the substrate parallel to the support, and then instantaneously returning the environment to atmospheric pressure, thereby uniformly bonding the flexible substrate to the adhesive layer. It is also possible to use a method in which the flexible substrate is gradually bonded to the adhesive layer e.g. by means of a rubber roller. When curing of the adhesive, constituting the adhesive layer, is performed by UV irradiation, UV light may be applied from the flexible substrate side. This is because the light blocking layer is formed between the flexible substrate and the support.

Preferably, in the flexible substrate-forming step, a glass substrate is used as the flexible substrate, a region in which a device is not to be formed is provided in a peripheral area of the flexible substrate, and a cut that surrounds a region in which a device (device element) is to be formed is provided in the non-device region of the flexible substrate. Accordingly, in the case where the flexible substrate is a thin glass substrate which is likely to break and a microcrack is present in a peripheral area of the substrate, if the microcrack grows into a crack e.g. due to thermal strain during a production process, the progress of cracking may be halted by the cut. In addition, detachment of the adhesive layer can be facilitated by detaching the adhesive layer after breaking the cut portion. The cut may be formed at a predetermined position on the flexible glass substrate e.g. with a glass cutter. In the flexible substrate-forming step, the cut may be formed either before or after bonding the flexible substrate to the adhesive layer.

The device-forming step is a step of forming a device (device element) on the flexible substrate at least through a step involving treatment with an acid or an alkali. As described above with reference to the laminate, the device preferably is an organic EL device, an organic transistor device or a solar cell device. Such a device tends to be deteriorated by leaking light when irradiating the photothermal conversion layer with light for detachment of the support. Further, an acid or alkali treatment step is needed for fine processing in the production of the device. Thus, the present invention is applied with more significance to such a device.

In the device-forming step, the device (device element) can be produced on the flexible substrate by an appropriate method known in the art. When an organic EL device is used as the device, an anode, a hole transport layer, a light-emitting layer and a cathode may be basically formed on the flexible substrate. The step involving treatment with an acid or an alkali can be exemplified by an acid etching step carried out upon patterning of an electrode, such as an ITO electrode, or an auxiliary electrode, an alkali treatment step carried out upon resist patterning in the formation of an insulating layer, and an alkali development step carried out in the formation of a cathode separator.

While the photothermal conversion layer-forming step, the light blocking layer-forming step, the adhesive layer-forming step, the flexible substrate-forming step and the device-forming step are basically carried out in the laminate production method of the present invention, an additional step or steps other than these steps may optionally be carried out. Examples of such steps include a support preparation step, a focus position-indicating mark-forming step, etc. Among them, a focus position-indicating mark-forming step is preferably carried out.

The focus position-indicating mark-forming step is a step of forming on the support a focus position-indicating mark(s) for focusing light onto the photothermal conversion layer. Owing to the use of the focus position-indicating mark(s), when the photothermal conversion layer is irradiated with light to decompose the photothermal conversion layer and thereby detach the support, the photothermal conversion layer can be more securely irradiated with light. This can reduce leakage of light into the device side, enabling enhanced protection of the device. The material, shape, height (depth), etc. of the focus position-indicating mark has already been described with reference to the laminate.

There is no particular limitation on the timing of the focus position-indicating mark-forming step in the laminate production method of the present invention. The focus position-indicating mark-forming step may be carried out, for example, before the photothermal conversion layer-forming step, simultaneously with the photothermal conversion layer-forming step, or simultaneously with the light blocking layer-forming step.

No particular limitation is placed on a method for forming the focus position-indicating mark(s) in the focus position-indicating mark-forming step. Examples of usable methods include PVD and CVD, such as vacuum vapor deposition, sputtering and ion plating, screen printing using a metal paste, etc. In the case where the photothermal conversion layer is opaque, and therefore it is difficult to focus light on a focus position-indicating mark(s) if it is provided in the photothermal conversion layer, a region where the photothermal conversion layer is absent may be provided, and a focus position-indicating mark(s) may be formed in the region (see the laminate 1D shown in FIG. 4). In this case, when the same material is used both for the focus position-indicating mark(s) and for the light blocking layer, the focus position-indicating mark(s) and the light blocking layer may be formed simultaneously, i.e. the focus position-indicating mark-forming step and the light blocking layer-forming step may be carried out simultaneously. For example, when aluminum is used for the focus position-indicating mark(s) and for the light blocking layer, the respective aluminum films may be formed simultaneously by vacuum vapor deposition with the use of a mask.

[Device Production Method]

The device production method of the present invention is a method for producing a device comprising a flexible substrate and a device (device element) formed on the substrate, and comprises: a photothermal conversion layer-forming step of forming a photothermal conversion layer on a support; a light blocking layer-forming step of forming a light blocking layer on the photothermal conversion layer; an adhesive layer-forming step of forming an adhesive layer on the light blocking layer such that it covers the side surface of the light blocking layer; a flexible substrate-forming step of forming a flexible substrate on the adhesive layer; a device-forming step of forming a device on the flexible substrate at least through a step involving treatment with an acid or an alkali; a photothermal conversion layer detachment step of irradiating the photothermal conversion layer with light, thereby detaching the support and the photothermal conversion layer; and an adhesive layer separation step of separating the adhesive layer from the flexible substrate. Thus, when the photothermal conversion layer is irradiated with light to decompose the photothermal conversion layer and thereby detach the support, the light blocking layer blocks light leaking into the device side, thereby protecting the device. In addition, because the adhesive layer covers the side surface of the light blocking layer to protect the light blocking layer, deterioration of the light blocking layer can be prevented even when the substrate is subjected to treatment with an acid or an alkali in the production of the device. The device production method of the present invention can thus successfully produce a device comprising the flexible substrate which is likely to bend or break, and a thin device formed on the substrate.

The photothermal conversion layer-forming step is a step of forming a photothermal conversion layer on a support. This step can be carried out in the manner described above with reference to the laminate production method.

The light blocking layer-forming step is a step of forming a light blocking layer on the photothermal conversion layer. This step can be carried out in the manner described above with reference to the laminate production method. For example, in this step the light blocking layer is preferably formed by vapor deposition of aluminum. When the photothermal conversion layer is irradiated with light to decompose the photothermal conversion layer and thereby detach the support, such an aluminum light blocking layer can more effectively block light leaking into the device side. On the other hand, such a light blocking layer is relatively easily deteriorated by treatment with an acid or an alkali in the production of a device. Protecting the side surface of the light blocking layer with an adhesive layer is therefore of more significance.

The adhesive layer-forming step is a step of forming an adhesive layer on the light blocking layer such that it covers the side surface of the light blocking layer. This step can be carried out in the manner described above with reference to the laminate production method. For example, the adhesive layer is preferably formed in this step such that it also covers the side surface of the photothermal conversion layer. This can prevent deterioration of the photothermal conversion layer when the substrate is treated with an acid or an alkali in the production of a device. The device production method of this embodiment can thus more successfully produce a device comprising the flexible substrate which is likely to bend or break, and a thin device formed on the substrate.

The flexible substrate-forming step is a step of forming a flexible substrate on the adhesive layer. This step can be carried out in the manner described above with reference to the laminate production method. For example, in this step, a glass substrate is used as the flexible substrate, a region in which a device is not to be formed is provided in a peripheral area of the flexible substrate, and a cut that surrounds a region in which a device is to be formed is provided in the non-device region of the flexible substrate. Accordingly, in the case where the flexible substrate is a thin glass substrate which is likely to break and a microcrack is present in a peripheral area of the substrate, if the microcrack grows into a crack e.g. due to thermal strain during a production process, the progress of cracking may be halted by the cut. In addition, detachment of the adhesive layer can be facilitated by detaching the adhesive layer after breaking the cut portion.

The device-forming step is a step of forming a device on the flexible substrate at least through a step involving treatment with an acid or an alkali. This step can be carried out in the manner described above with reference to the laminate production method. For example, the device produced in this step preferably is an organic EL device, an organic transistor device or a solar cell device. Such a device tends to be deteriorated by leaking light when irradiating the photothermal conversion layer with light for detachment of the support. Further, an acid or alkali treatment step is needed for fine processing in the production of the device. Thus, the present invention is applied with more significance to such a device.

As described above with reference to the laminate production method, the device production method of the present invention may optionally include an additional step or steps. For example, the device production method preferably further includes a focus position-indicating mark-forming step of forming on the support a focus position-indicating mark(s) for focusing light onto the photothermal conversion layer. This step can be carried out in the manner described above with reference to the laminate production method. Owing to the use of the focus position-indicating mark(s), when the photothermal conversion layer is irradiated with light to decompose the photothermal conversion layer and thereby detach the support, the photothermal conversion layer can be more securely irradiated with light. This can reduce leakage of light into the device side, enabling enhanced protection of the device.

Figure 7A:
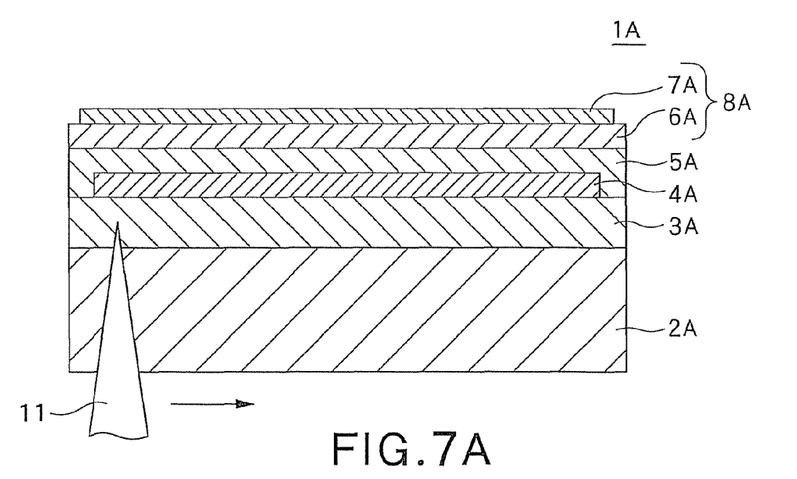
FIGS. 7A and 7B are schematic cross-sectional views illustrating an exemplary photothermal conversion layer detachment step in a device production method according to the present invention.
Figure 7B:
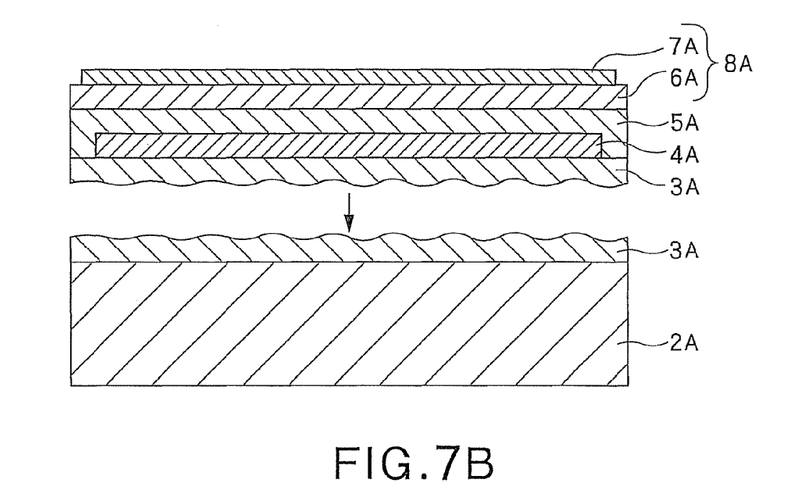

The photothermal conversion layer detachment step is a step of irradiating the photothermal conversion layer with light, thereby detaching the support and the photothermal conversion layer. FIGS. 7A and 7B are schematic cross-sectional views illustrating an exemplary photothermal conversion layer detachment step in the device production method of the present invention. In particular, FIG. 7A illustrates an operation in which for the laminate 1A (see FIG. 1) which has been produced through the photothermal conversion layer-forming step, the light blocking layer-forming step, the adhesive layer-forming step, the flexible substrate-forming step and the device-forming step, the photothermal conversion layer 3A is irradiated with laser light 11 (YAG laser light) to decompose the photothermal conversion layer 3A. FIG. 7B illustrates the operation of separating the photothermal conversion layer 3A after the irradiation with the laser light 11, thereby detaching the support 2A. The photothermal conversion layer detachment step will now be described in more detail.

In the photothermal conversion layer detachment step, the photothermal conversion layer 3A is irradiated with the laser light 11 as shown in FIG. 7A. During the irradiation, the laser light 11 is allowed to scan across the photothermal conversion layer 3A so that the entire area of the photothermal conversion layer 3A can be irradiated with the laser light 11.

The number of scans of the laser light 11 (number of irradiation operations for the photothermal conversion layer 3A) in the photothermal conversion layer detachment step may be such as to surely decompose the photothermal conversion layer 3A. Though the number of scans of the laser light 11 preferably is one from the viewpoint of increasing the production efficiency, the number of scans may be two or more from the viewpoint of securely performing the separation of the photothermal conversion layer 3A and thereby increasing the yield. As described above with reference to the laminate, when the number of scans is two or more, there is a fear that the device 7A may be destroyed by leakage of the irradiating laser light 11 into the device 7A which can occur due to the presence of air bubbles between the flexible substrate 6A and the adhesive layer 5A. Though not shown in FIG. 7, in order to prevent the problem, it is preferred to provide a focus position-indicating mark(s) on the support to focus the laser light 11 onto the photothermal conversion layer 3A, as also described above. Thus, in this case, the laminate 1C shown in FIG. 3 may be used instead of the laminate 1A shown in FIG. 1. In the laminate 1C, the photothermal conversion layer is irradiated with laser light after focusing the laser light on the focus position-indicating marks e.g. with a laser emitting device. The laser light 11, which is YAG laser light (wavelength: 1064 nm), is used as in FIG. 7; however, as described above with reference to the laminate, irradiating light is not limited to laser light, and any light that can decompose the photothermal conversion layer 3A can be used.

In the photothermal conversion layer detachment step, the photothermal conversion layer 3A is decomposed by irradiating the layer with the laser light. While no particular limitation is placed on the mechanism of the decomposition and the composition of the photothermal conversion layer 3A related to the mechanism, the photothermal conversion layer 3A generally contains a light absorbing agent and a heat decomposable resin. The radiation energy of the laser light 11 is absorbed by the light absorbing agent and converted into heat energy. The heat energy then rapidly raise the temperature of the photothermal conversion layer 3A and, when the temperature reaches the heat decomposition temperature of the heat decomposable resin (organic component), the heat decomposable resin thermally decomposes (carbonizes). A gas generated by the heat decomposition creates a void layer in the photothermal conversion layer 3A, whereby the photothermal conversion layer 3A is separated into two.

In the photothermal conversion layer detachment step, the photothermal conversion layer 3A and the support 2A are detached from the device 8A side as shown in FIG. 7B. Though in this embodiment decomposition/separation occurs within the photothermal conversion layer 3A, there are cases in which decomposition/separation occurs at the interface between the photothermal conversion layer 3A and the support 2A or at the interface between the photothermal conversion layer 3A and the light blocking layer 4A. The support 2A can thus be detached from the laminate. When the support 2A cannot be detached from the photothermal conversion layer 3A easily, an acute-angled tool such as a cutter may be inserted, between the photothermal conversion layer 3A and the support 2A to facilitate detachment.

Figure 8:
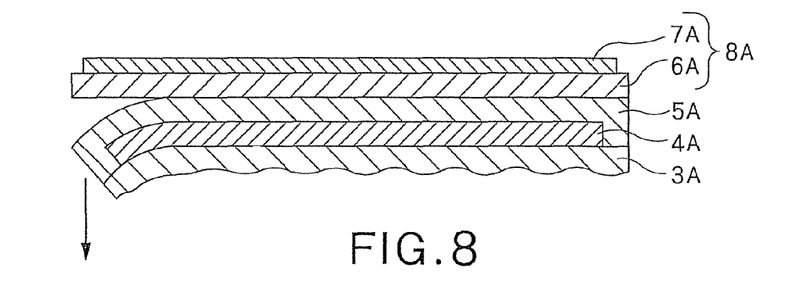
FIG. 8 is a schematic cross-sectional view illustrating an exemplary adhesive layer separation step in a device production method according to the present invention.

The adhesive layer separation step is a step of separating the adhesive layer from the flexible substrate. FIG. 8 is a schematic cross-sectional view illustrating an exemplary adhesive layer separation step in the device production method of the present invention. The adhesive layer 5A, formed of the material described above with reference to the laminate, on the one hand has an adhesive power necessary to fix the flexible substrate 6A to the support 2A, and on the other can be easily peeled from the flexible substrate 6A. Therefore, as shown in FIG. 8, the adhesive layer 5A, the light blocking layer 4A and the residual photothermal conversion layer 3A can be separated from the device 8A at the interface between the adhesive layer 5A and the flexible substrate 6A. Though not shown in FIG. 8, in order to facilitate the separation, it is possible to attach a peel-off tape to the adhesive layer 5A side prior to the separation.

[Device]

The device according to the present invention is produced by the device production method of the present invention. Thus, when the photothermal conversion layer is irradiated with light to decompose the photothermal conversion layer and thereby detach the support, the light blocking layer blocks light leaking into the device element side, thereby protecting the device element. In addition, because the adhesive layer covers the side surface of the light blocking layer to protect the light blocking layer, deterioration of the light blocking layer can be prevented even when the substrate is subjected to treatment with an acid or an alkali in the production of the device. The device production method of the present invention can thus successfully produce the device comprising the flexible substrate which is likely to bend or break, and a thin device element formed on the substrate.

The device preferably is an organic EL device, an organic transistor device or a solar cell device. The device according to the present invention, because it is produced by the device production method of the present invention, can be a thin device. The thickness of the thin device is generally not less than 5 μm and not more than 5 mm in view of possibility use of a thick sealing substrate. The flexible substrate and the device element, constituting such a device, have already been described with reference to the laminate, and hence a description thereof is omitted.

EXPERIMENTAL EXAMPLES

The present invention will now be further described by reference to the following experimental examples, which illustrate the prevent invention but are not intended to limit its scope.

Example 1

Production of Laminate

A 0.7 mm thick glass plate was used as a support. A photothermal conversion layer was formed on the support (photothermal conversion layer-forming step). More specifically, a resin precursor solution of a UV curable acrylic resin, containing a photopolymerization initiator and carbon blacks, was prepared, and the solution was applied onto the support by spin coating. Thereafter, the coating was irradiated with ultraviolet light to cure the resin, thereby forming a 1 μm thick photothermal conversion layer.

Next, a light blocking layer was formed on the photothermal conversion layer (light blocking layer-forming step). More specifically, aluminum was deposited onto the photothermal conversion layer by vacuum vapor deposition, thereby forming a 300 nm thick aluminum film as a light blocking layer. The light blocking layer was not formed on the entire surface of the photothermal conversion layer: the vacuum vapor deposition was carried out using a mask so that the light blocking layer was not formed in a 5 mm-width peripheral area from the edge of the photothermal conversion layer.

Next, an adhesive layer was formed on the light blocking layer such that it covers the side surface of the light blocking layer (light blocking layer-forming step). Thereafter, a flexible substrate was formed on the adhesive layer (flexible substrate-forming step). More specifically, a UV curable acrylic adhesive was applied by screen printing onto the light blocking layer and onto the peripheral area of the photothermal conversion layer where the light blocking layer was not present, thereby forming an adhesive layer. Thereafter, using a thin glass having a thickness of 100 μm as a flexible substrate, the thin glass was placed on the uncured adhesive layer. The adhesive layer was then irradiated with ultraviolet light, applied from the thin glass side, to cure the adhesive layer. The thickness of the resulting adhesive layer was 20 μm.

Next, an organic EL device was formed on the flexible substrate (thin glass). The organic EL device was produced by forming on the flexible substrate an anode, a hole transport layer, a light-emitting layer and a cathode. In the production of the device, an ITO electrode was used as the anode, and patterning for the electrode was carried out by acid etching.

Further, to form each pixel of the organic EL device, a cathode separator for separation of the cathode was formed by alkali development. Despite such treatments with an acid or an alkali in the production of the organic EL device, there was no deterioration or erosion of the light blocking layer (evaporated aluminum film). Thereafter, a sealing substrate (gas barrier film) was attached to the device such that it covers the cathode side, and a FPC (flexible printed circuit) was connected to the ITO electrode for interconnection.

<Production of Device>

The photothermal conversion layer of the laminate thus produced was irradiated with laser light to detach the support and the photothermal conversion layer (photothermal conversion layer detachment step). More specifically, YAG laser light was applied from the support side of the laminate and allowed to scan across the entire area of the photothermal conversion layer. The scanning was performed twice. The light irradiation caused carbonization of the acrylic resin in the photothermal conversion layer and separation of the photothermal conversion layer, thereby detaching the support and part of the photothermal conversion layer from the laminate. The YAG laser irradiation conditions were as follows: laser power, 17 W; laser diameter, 200 µm; and irradiation pitch, 200 µm.

Next, the adhesive layer was separated from the flexible substrate (adhesive layer separation step). More specifically, while fixing the flexible substrate side by attraction, a peel-off tape was attached to the adhesive layer and the adhesive layer was peeled from the thin glass, thereby separating the adhesive layer, the light blocking layer and the residual photothermal conversion layer from the flexible substrate.

A device, comprising the flexible substrate (thin glass) and the organic EL device formed on it, was thus obtained through the above steps.

<Evaluation of Light-Emitting Properties>

The organic EL device thus obtained was allowed to emit light, and a 1 mm×1 mm light-emitting area was observed. As a result, the entire area was found to be luminous. Detailed observation of the area at a pixel level, however, revealed a damaged area (weakly luminous area) in a small proportion of pixels. After scrutinizing the production steps, it was found that the damaged area corresponds to a region where air bubbles had been present between the flexible substrate (thin glass) and the adhesive layer. Thus, it was found that damage was caused to a pixel which lies in the area corresponding to the region where air bubbles were present.

Example 2

A laminate and a device were produced in the same manner as in Example 1 except that focus position-indicating marks were provided in the photothermal conversion layer. More specifically, as shown in the laminate 1D of FIG. 4, a region where the photothermal conversion layer 3D is not formed was provided, and focus position-indicating marks 9C, 9D, each having a cross shape, were formed at five positions on the support by vacuum vapor deposition of aluminum using a mask (focus position-indicating mark-forming step). In the photothermal conversion layer detachment step, the photothermal conversion layer was irradiated with YAG laser light after focusing the laser light on the focus position-indicating marks by using a laser emitting device.

For the organic EL device thus obtained, the light-emitting properties were evaluated in the same manner as in Example 1. As a result, the entire 1 mm×1 mm light-emitting area was found to be luminous. No damaged area was observed even for a pixel which lies over a region where air bubbles had been present.

Comparative Example 1

A laminate and a device were produced in the same manner as in Example 1 except that the light blocking layer was not formed (light blocking layer-forming step was not carried out). For the organic EL device thus obtained, the light-emitting properties were evaluated in the same manner as in Example 1. As a result, non-luminous areas were observed in a stripe pattern along the scan direction of YAG laser light. Thus, it was found that due to the absence of a light blocking layer, the YAG laser light, applied to the photothermal conversion layer to separate it, causes damage to the entire organic EL device.

What is claimed is:

1. A laminate comprising:
    a support;
    a photothermal conversion layer provided on the support;
    a light blocking layer formed on the photothermal conversion layer;
    an adhesive layer formed on the light blocking layer; a flexible substrate formed on the adhesive layer; and
    a device element formed on the flexible substrate, wherein the support can be detached from the other layers by irradiating the photothermal conversion layer with light, and wherein the adhesive layer is formed such that it covers the side surface of the light blocking layer.

2. The laminate according to claim 1, wherein the adhesive layer is formed such that it further covers the side surface of the photothermal conversion layer.

3. The laminate according to claim 1, wherein the light blocking layer functions as a light reflecting layer.

4. The laminate according to claim 1, wherein a focus position-indicating mark for focusing light onto the photothermal conversion layer is provided on the support.

5. The laminate according to claim 1, wherein a glass substrate is used as the flexible substrate, a region in which the device element is not formed is present in a peripheral area of the flexible substrate, and a cut that surrounds the device element is provided in the region of the flexible substrate.

6. The laminate according to claim 1, wherein the device element is one of an organic EL device, an organic transistor device and a solar cell device.

7. A preparatory support for use in a laminate, the laminate comprising: a support; a photothermal conversion layer provided on the support; a light blocking layer formed on the photothermal conversion layer; an adhesive layer formed on the light blocking layer; a flexible substrate formed on the adhesive layer; and a device element formed on the flexible substrate, wherein the support can be detached from the other layers by irradiating the photothermal conversion layer with light, and wherein the adhesive layer is formed such that it covers the side surface of the light blocking layer, said preparatory support comprising:
    a support; and
    a photothermal conversion layer provided on the support.

8. A method for producing a laminate, the laminate comprising: a support; a photothermal conversion layer provided on the support; a light blocking layer formed on the photothermal conversion layer; an adhesive layer formed on the light blocking layer; a flexible substrate formed on the adhesive layer; and a device element formed on the flexible substrate, wherein the support can be detached from the other layers by irradiating the photothermal conversion layer with light, and wherein the adhesive layer is formed such that it, covers the side surface of the light blocking layer, said method comprising:

a photothermal conversion layer-forming step of forming a photothermal conversion layer on a support;

a light blocking layer-forming step of forming a light blocking layer on the photothermal conversion layer;

an adhesive layer-forming step of forming an adhesive layer on the light blocking layer such that it covers the side surface of the light blocking layer;

a flexible substrate-forming step of forming a flexible substrate on the adhesive layer; and a device-forming step of forming a device element on the flexible substrate at least through a step involving treatment with an acid or an alkali.

9. A method for producing a device comprising a flexible substrate and a device element formed on the substrate, said method comprising:

a photothermal conversion layer-forming step of forming a photothermal conversion layer on a support;

a light blocking layer-forming step of forming a light blocking layer on the photothermal conversion layer;

an adhesive layer-forming step of forming an adhesive layer on the light blocking layer such that it covers the side surface of the light blocking layer;

a flexible substrate-forming step of forming a flexible substrate on the adhesive layer;

a device-forming step of forming a device element on the flexible substrate at least through a step involving treatment with an acid or an alkali;

a photothermal conversion layer detachment step of irradiating the photothermal conversion layer with light, thereby detaching the support from the other layers; and an adhesive layer separation step of separating the adhesive layer from the flexible substrate.

10. The method for producing a device according to claim 9, wherein in the adhesive layer-forming step, the adhesive layer is formed such that it further covers the side surface of the photothermal conversion layer.

11. The method for producing a device according to claim 9, wherein in the light blocking layer-forming step, the light blocking layer is formed by vapor deposition of aluminum.

12. The method for producing a device according to claim 9, further comprising a focus position-indicating mark-forming step of forming on the support a focus position-indicating mark for focusing light onto the photothermal conversion layer.

13. The method for producing a device according to claim 9, wherein in the flexible substrate-forming step, a glass substrate is used as the flexible substrate, a region in which the device element is not to be formed is provided in a peripheral area of the flexible substrate, and a cut that is to surround the device element is provided in the region of the flexible substrate.

14. The method for producing a device according to claim 9, wherein the device element formed on the substrate is one of an organic EL device, an organic transistor device and a solar cell device.

* * * * *